(12) United States Patent
Chen et al.

(10) Patent No.: US 11,323,079 B2
(45) Date of Patent: May 3, 2022

(54) STABILITY IMPROVEMENT CIRCUIT FOR RADIO FREQUENCY (RF) POWER AMPLIFIERS

(71) Applicant: QUALCOMM Incorporated, San Diego, CA (US)

(72) Inventors: Jing-Hwa Chen, Sudbury, MA (US); Junzhi Yu, Marlborough, MA (US); Yan Kit Gary Hau, Westford, MA (US); Guoqing Fu, Medford, MA (US); Xinwei Wang, Dunstable, MA (US); Xiangdong Zhang, Westford, MA (US)

(73) Assignee: QUALCOMM Incorporated, San Diego, CA (US)

( * ) Notice: Subject to any disclaimer, the term of this patent is extended or adjusted under 35 U.S.C. 154(b) by 4 days.

(21) Appl. No.: 16/804,929

(22) Filed: Feb. 28, 2020

(65) Prior Publication Data

US 2021/0273615 A1 Sep. 2, 2021

(51) Int. Cl.
| | |
|---|---|
| *H03F 3/191* | (2006.01) |
| *H03F 1/56* | (2006.01) |
| *H03F 3/24* | (2006.01) |
| *H03F 1/02* | (2006.01) |
| *H03F 3/60* | (2006.01) |
| *H03F 3/195* | (2006.01) |

(52) U.S. Cl.
CPC ........... *H03F 1/565* (2013.01); *H03F 1/0222* (2013.01); *H03F 3/195* (2013.01); *H03F 3/245* (2013.01); *H03F 3/60* (2013.01)

(58) Field of Classification Search
CPC ....................................................... H03F 3/191
USPC ........................................ 330/302, 305, 310
See application file for complete search history.

(56) References Cited

U.S. PATENT DOCUMENTS

| | | | | |
|---|---|---|---|---|
| 5,406,224 A | * | 4/1995 | Mikami | ................. H03F 1/086 330/277 |
| 5,592,122 A | | 1/1997 | Masahiro et al. | |
| 6,614,311 B2 | * | 9/2003 | Takenaka | ............... H03F 3/601 330/302 |
| 7,443,236 B2 | * | 10/2008 | Dow | ........................ H03F 1/14 330/129 |
| 7,554,410 B2 | * | 6/2009 | Kawashima | .............. H03F 1/56 330/302 |
| 7,567,128 B2 | * | 7/2009 | Oka | ......................... H03F 1/56 330/302 |
| 7,639,101 B2 | | 12/2009 | Tsuzuki et al. | |
| 9,031,520 B2 | | 5/2015 | McCallister | |
| 9,705,473 B2 | | 7/2017 | David et al. | |
| 2007/0089513 A1 | | 4/2007 | Rosenau et al. | |

* cited by examiner

*Primary Examiner* — Henry Choe
(74) *Attorney, Agent, or Firm* — Patterson & Sheridan, LLP

(57) ABSTRACT

Certain aspects of the present disclosure are directed to an amplifier. The amplifier may include a transistor coupled to an output of the amplifier, and a resonator coupled between the output of the amplifier and a reference potential node, a resonant frequency of the resonator being set to be at a subharmonic of a fundamental frequency of the amplifier, and an impedance of the resonator being greater than a load impedance of the amplifier at the fundamental frequency of the amplifier.

29 Claims, 6 Drawing Sheets

STABILITY IMPROVEMENT CIRCUIT FOR RADIO FREQUENCY (RF) POWER AMPLIFIERS

FIELD OF THE DISCLOSURE

The present disclosure generally relates to electronic circuits, and more particularly, to techniques and apparatus for signal amplification.

DESCRIPTION OF RELATED ART

Electronic device technologies have seen explosive growth over the past several years. For example, growth of cellular and wireless communication technologies has been fueled by better communications hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Such mobile electronic devices may include radio-frequency (RF) front-end circuitry which may perform amplification of signals for transmission via a power amplifier (PA).

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Certain aspects of the present disclosure are directed to circuitry and techniques for reducing a subharmonic component of an amplification signal.

Certain aspects of the present disclosure are directed to an amplifier. The amplifier may include a transistor coupled to an output of the amplifier, and a resonator coupled between the output of the amplifier and a reference potential node, a resonant frequency of the resonator being set to be at a subharmonic of a fundamental frequency of the amplifier, and an impedance of the resonator being greater than a load impedance of the amplifier at the fundamental frequency of the amplifier.

Certain aspects of the present disclosure are directed to an amplifier. The amplifier may include a transistor coupled to an output of the amplifier, and a signal path coupled between the output of the amplifier and a reference potential node, the signal path being configured to sink current at a subharmonic of a fundamental frequency of the amplifier, an impedance of the signal path being greater than a load impedance of the amplifier at the fundamental frequency of the amplifier.

Certain aspects of the present disclosure are directed to a method for signal amplification. The method generally includes amplifying, via an amplifier, an input signal to generate an amplification signal at an output node, and sinking, via a signal path coupled to the output node, current at a subharmonic of a fundamental frequency of the amplification signal, an impedance of the signal path being greater than a load impedance of the amplifier at the fundamental frequency of the amplification signal.

Certain aspects of the present disclosure are directed to an apparatus for signal amplification. The apparatus generally includes means for amplifying an input signal to generate an amplification signal at an output node, and means for sinking, from the output node, current at a subharmonic of a fundamental frequency of the amplification signal, an impedance of the means for sinking being greater than a load impedance of the means for amplifying at the fundamental frequency of the amplification signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
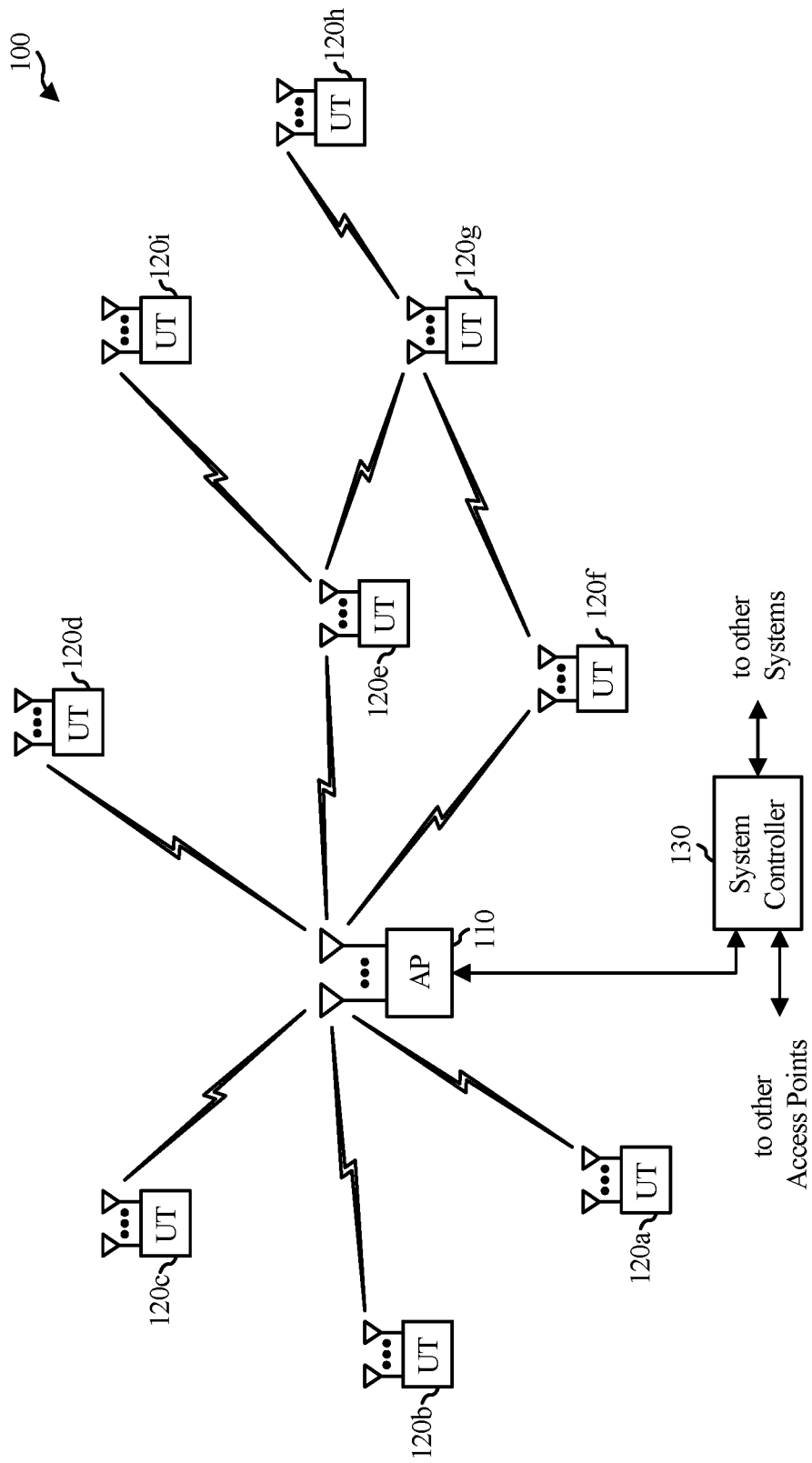
FIG. 1 illustrates a wireless communications system with access points and user terminals, in which aspects of the present disclosure may be practiced.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include a power amplifier (PA) having circuitry for reducing a subharmonic component of an amplification signal generated by the PA, as described in more detail herein.

Figure 2:
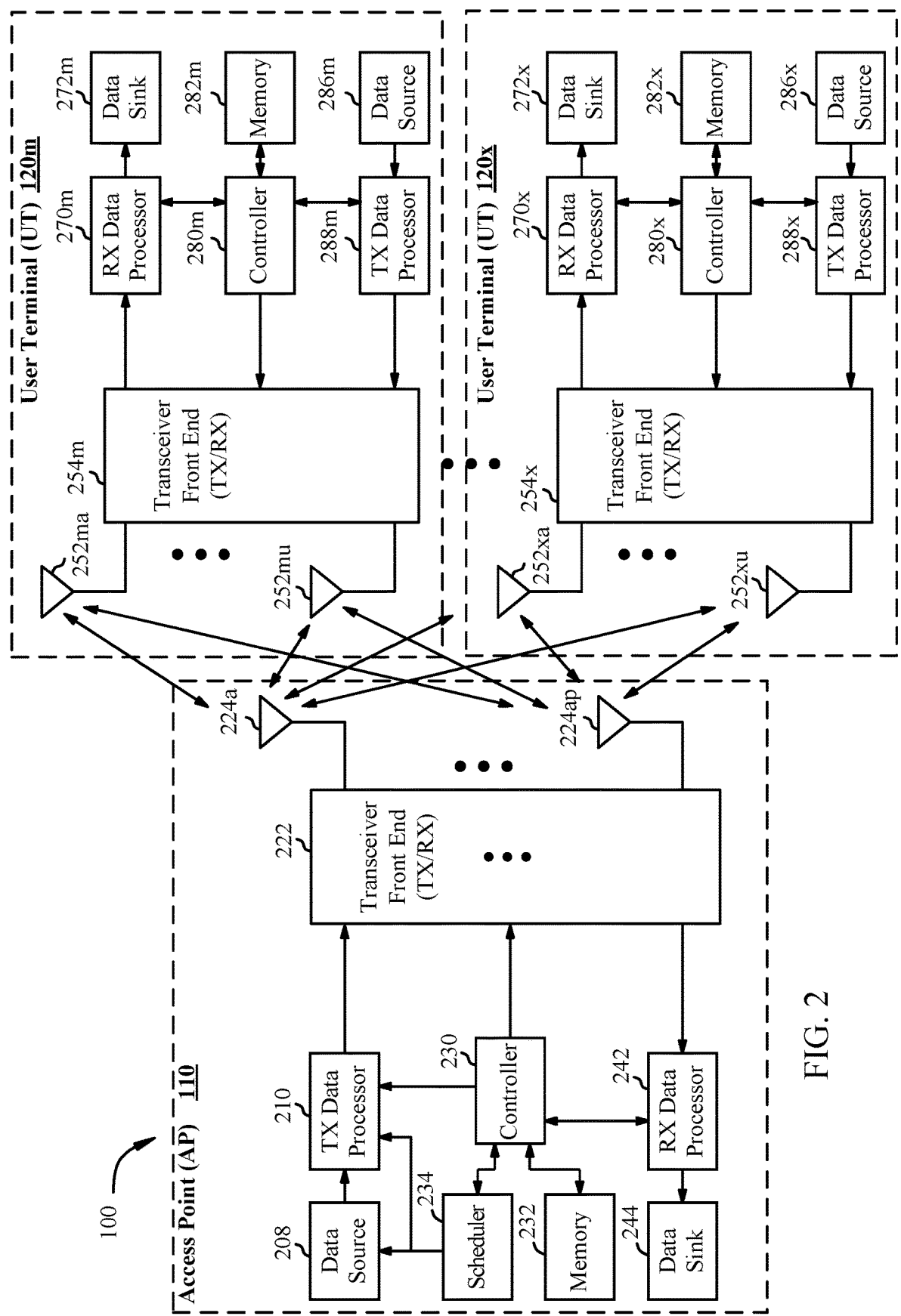
FIG. 2 is a block diagram illustrating an access point and two user terminals of a wireless system, in which aspects of the present disclosure may be practiced.

FIG. 2 shows a block diagram of access point 110 and two user terminals 120m and 120x in wireless system 100.

Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front-end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via a radio-frequency (RF) switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. In certain aspects, the transceiver front end (TX/RX) 222 of access point 110 and/or transceiver front end 254 of user terminal 120 may include a PA having circuitry for reducing a subharmonic component of an amplification signal generated by the PA, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
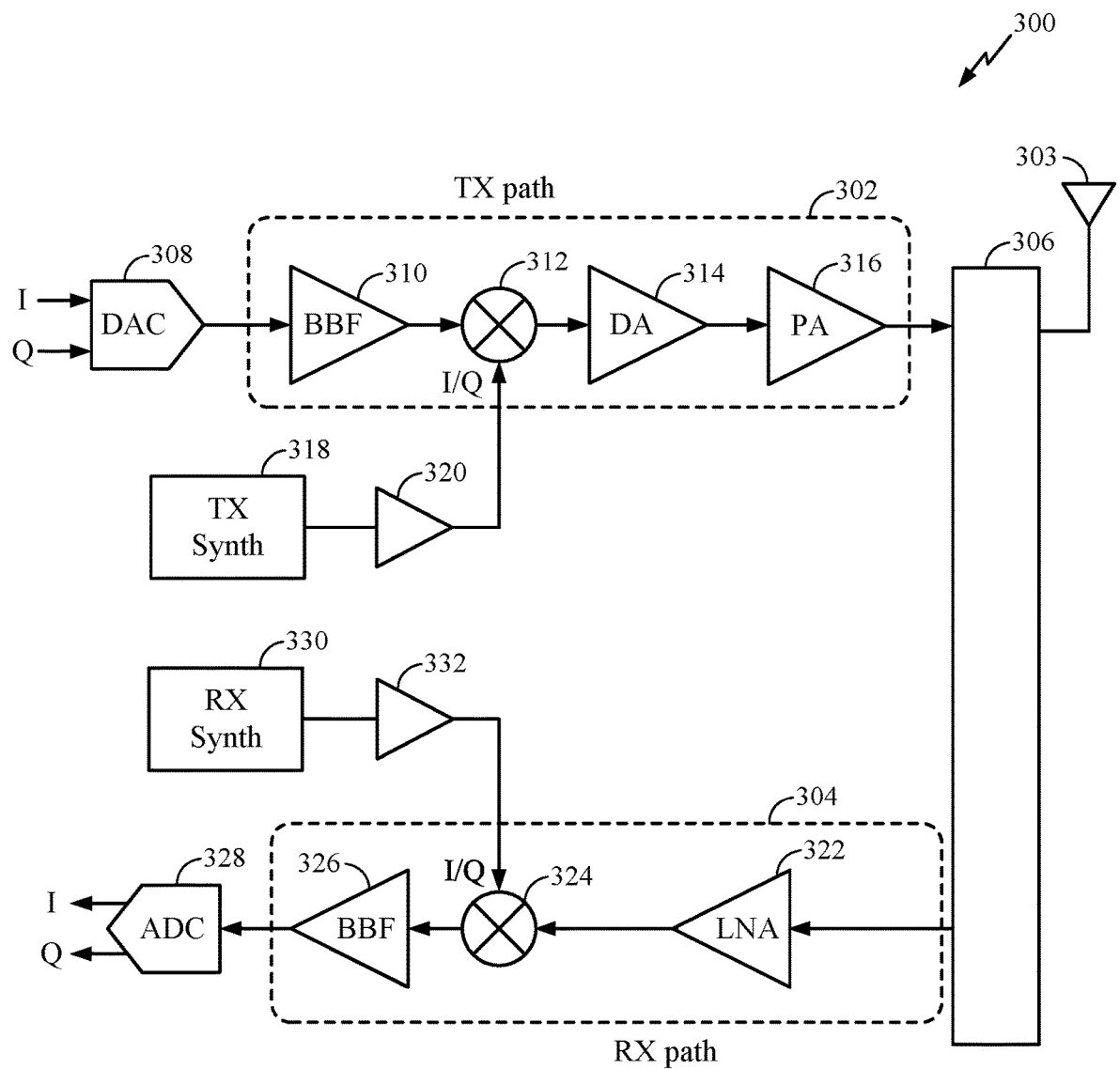
FIG. 3 is a block diagram of an example transceiver front end, in which aspects of the present disclosure may be practiced.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The PA 316 may include circuitry for reducing a subharmonic component of an amplification signal generated by the PA, as described in more detail herein. The BBF 310, the mixer 312, and the DA 314 may be included in a radio frequency integrated circuit (RFIC), while the PA 316 may be external to the RFIC, in some implementations. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

While FIGS. 1-3 provide a wireless communication system as an example application in which certain aspects of the present disclosure may be implemented to facilitate understanding, certain aspects described herein may be used for signal amplification in any of various other suitable systems (e.g., any electronic system).

Example Stability Improvement Circuit for Radio Frequency (RF) Power Amplifiers

Parametric oscillation is a challenge for radio frequency (RF) power amplifier (PA) design. Despite the PA being stable in small-signal and direct current (DC) operation, oscillation may still occur when the PA is driven near compression. Some PAs, especially PAs operating in low-band (LB) frequency, may suffer from parametric oscillation. Certain aspects of the present disclosure are directed to a sub-harmonic resonance circuit at the PA power cell collector (e.g., collector of a transistor of the PA) to reduce the parametric oscillation with little to no impact on RF performance of the PA, as described in more detail herein.

Figure 4:
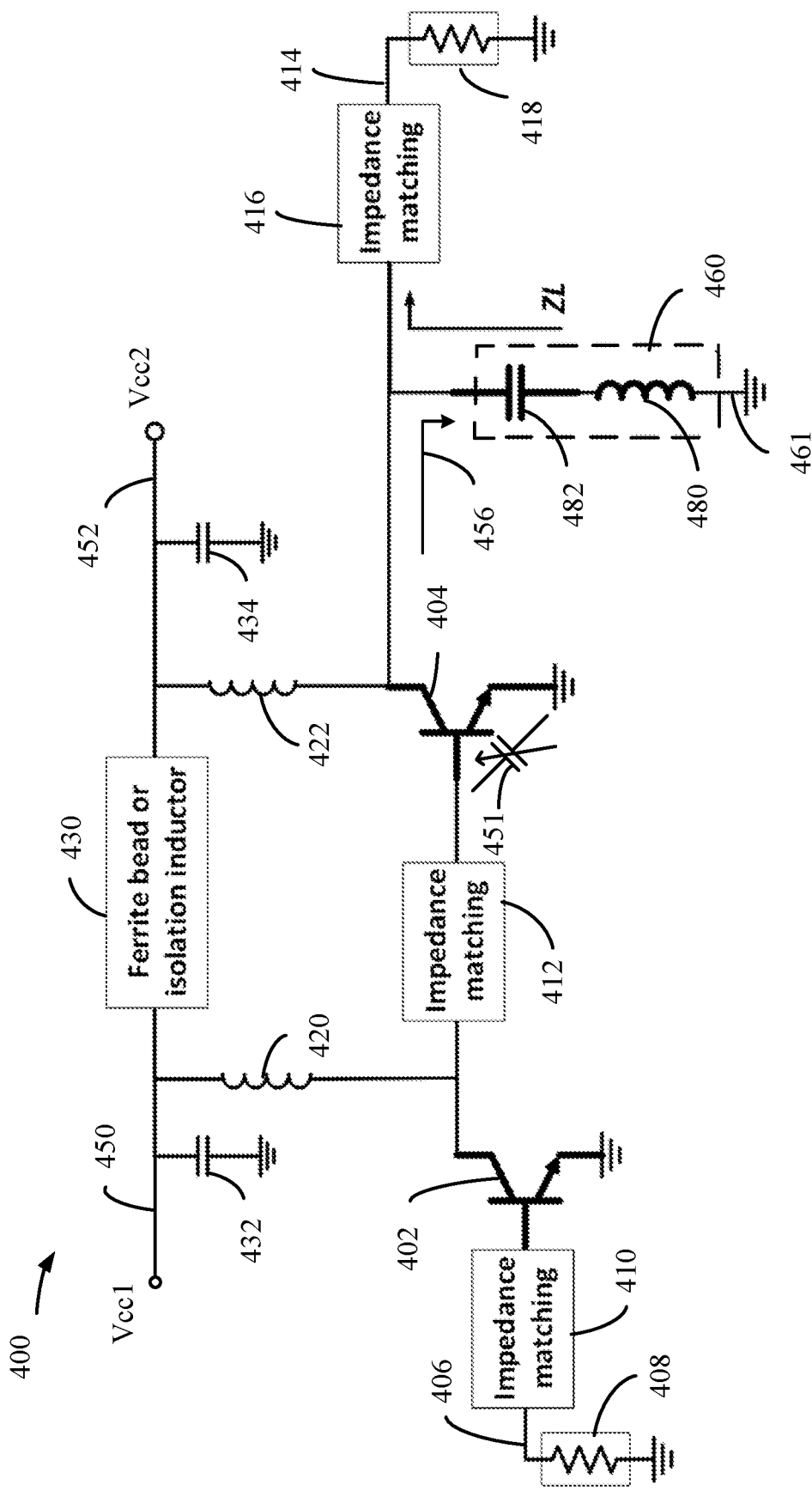
FIG. 4 illustrates an amplifier, in accordance with certain aspects of the present disclosure.

FIG. 4 illustrates an amplifier 400, in accordance with certain aspects of the present disclosure. As illustrated, the amplifier 400 may include heterojunction bipolar transistors (HBTs) 402, 404 for amplification of a signal at an input node 406 of the amplifier 400. A resistive element 408 represents the input impedance of the amplifier 400. As illustrated, an impedance-matching network 410 may be coupled between the input node 406 and the base of the HBT 402. Moreover, an impedance-matching network 412 may be coupled between the collector of the HBT 402 and the base of the HBT 404. Another impedance-matching network 416 may be coupled between the collector of the HBT 404 and an output node 414 of the amplifier 400. A resistive element 418 represents the load impedance of the amplifier 400. The collector of the HBT 402 may be coupled to a first voltage supply node 450 (Vcc1), and the collector of the HBT 404 may be coupled to a second voltage supply node 452 (Vcc2).

The non-linear capacitance (e.g., base-emitter capacitance 451) of the HBT 404 varies with the input RF drive (e.g., at the base of the HBT 404) resulting in increased subharmonic components at the collector of HBT 404 when the amplifier 400 is driven into compression and/or under strong load mismatch conditions. The subharmonic component at the collector of the HBT 404 may then be fed back to the base of the HBT 404 through Vcc1 and Vcc2 chokes (e.g., represented by inductive elements 420, 422) and/or locally through the HBT parasitic capacitance (e.g., through the base-collector capacitance ($C_{bc}$) of the HBT 404). Accordingly, parametric oscillation may occur when a positive feedback loop is formed when the intermodulation products of the amplifier 400 fall into the sub-harmonic component at the collector of the HBT 404. The feedback loop through the voltage supply nodes (e.g., Vcc1 and Vcc2) may be eliminated (or at least reduced) by inserting an isolation inductive element 430 (e.g., ferrite bead) between the supply nodes, and including decoupling capacitive elements 432, 434 coupled to respective voltage supply nodes Vcc1, Vcc2.

Certain aspects of the present disclosure are directed to circuitry and techniques for attenuating the local feedback loop for the subharmonic component at the collector of the HBT 404. For example, subharmonic trap circuitry may be implemented in a signal path 456 using an inductor-capacitor (LC) resonator 460. The LC resonator 460 may be coupled between the collector of HBT 404 and a reference potential node 461 (e.g., electric ground). In certain aspects, the LC resonator 460 may be implemented as a series LC resonator having an inductive element 480 coupled in series with a capacitive element 482.

The gain associated with the local parasitic capacitance feedback loop may be reduced using the LC resonator 460. The LC resonator 460 may be configured to have an impedance (Z) of zero (or at least close to zero) at a frequency of:

$$\frac{1}{n} f_0$$

where n is an integer greater than 1, $f_0$ is the fundamental frequency of the amplifier 400, and Z is the impedance of the LC resonator 460. In other words, the impedance associated with the signal path 456 may be zero (or at least close to zero, depending on trace impedance associated with the signal path 456) at a subharmonic of a fundamental frequency of the amplifier 400.

To reduce the gain associated with the local parasitic capacitance feedback loop, the LC resonator 460 may be configured to resonate at a subharmonic of the fundamental frequency of the amplifier 400. The LC resonator 460 effectively implements a short circuit between the collector of the HBT 404 and the reference potential node 461 (e.g., electric ground) at the resonant frequency, which is configured to be equal to the subharmonic of the fundamental frequency $f_0$ of the amplifier 400.

The LC resonator 460 may also be configured to satisfy having an impedance (Z) that is greater than the load impedance ($Z_L$) of the amplifier 400 at the fundamental frequency $f_0$. That is, the LC resonator 460 may present high impedance at the fundamental frequency $f_0$ of the amplifier 400, such that the LC resonator 460 does not impact the RF performance of the amplifier 400.

Certain aspects of the present disclosure provide techniques for increasing the bandwidth coverage of the sub-harmonic trap circuitry (e.g., LC resonator 460), described herein. For example, a wireless communications system (e.g., the wireless communications system 100) may be configurable to operate in different bands which may correspond to different fundamental frequencies of the amplifier 400. Thus, the sub-harmonic trap circuitry may be configurable for different bands of operations, and corresponding subharmonics.

Figure 5C:
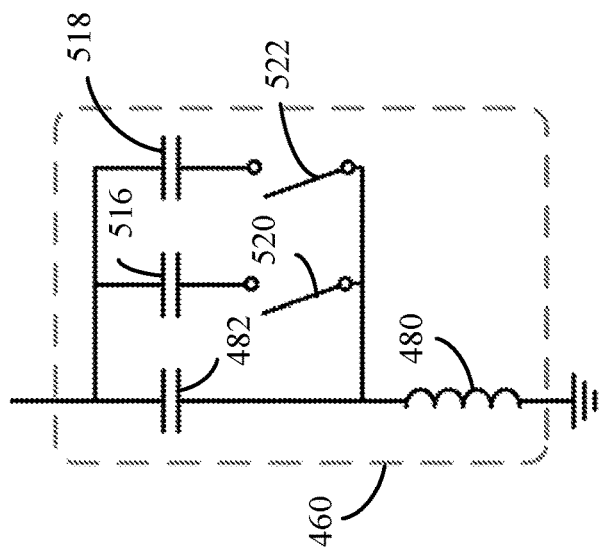
FIGS. 5A, 5B, and 5C illustrate example implementations of subharmonic trap circuitry, in accordance with certain aspects of the present disclosure.
Figure 5B:
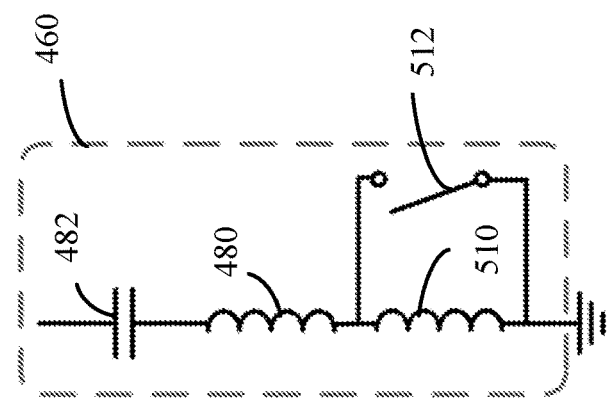
Figure 5A:
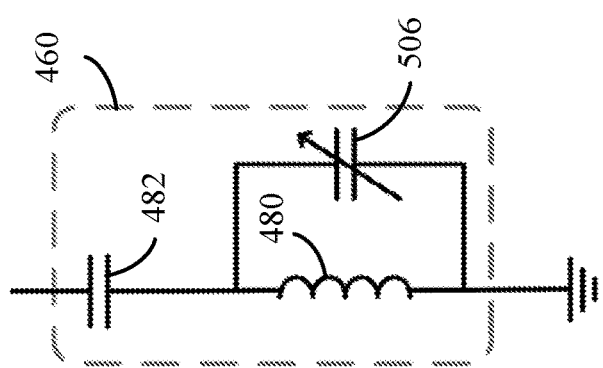

FIGS. 5A, 5B, and 5C illustrate example implementations of subharmonic trap circuitry (e.g., LC resonator 460), in accordance with certain aspects of the present disclosure. For example, the impedance of the LC resonator 460 may be tunable, allowing the LC resonator 460 to be tuned for different bands of operations, as described herein. As illustrated in FIG. 5A, a variable capacitive element 506 may be coupled in parallel with the inductive element 480 of the LC resonator 460. The capacitance of the variable capacitive element 506 may be adjusted (e.g., via controller 230 or controller 280) to tune the resonance of the LC resonator 460.

As illustrated in FIG. 5B, an inductive element 510 coupled in series with the inductive element 480 may be selectively shorted out. For example, a switch 512 may be coupled in parallel with the inductive element 510, which may be controlled to adjust the resonant frequency of the LC resonator 460.

As illustrated in FIG. 5C, a digitally controlled capacitive element may be used to program the resonance frequency of the LC resonator 460. For example, capacitive elements 516, 518 may be selectively coupled in parallel with the capacitive element 482 via respective switches 520, 522 to adjust the resonant frequency of the LC resonator 460. The switches 520, 522 may be controlled via digital signals (e.g., from controller 230 or controller 280).

Figure 6:
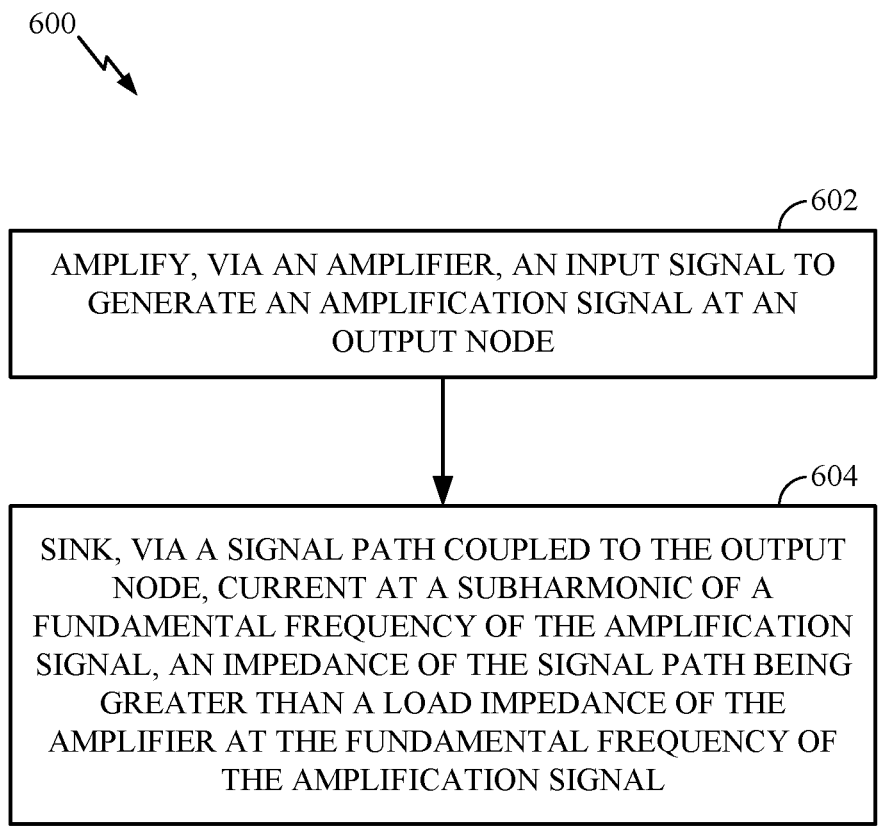
FIG. 6 is a flow diagram illustrating example operations for signal amplification, in accordance with certain aspects of the present disclosure.

FIG. 6 is a flow diagram illustrating example operations 600 for signal amplification, in accordance with certain aspects of the present disclosure. The operations 600 may be performed by an amplifier, such as the amplifier 400, and/or a controller, such as the controller 230 or controller 280.

The operations 600 begin, at block 602, with the amplifier amplifying an input signal (e.g., input signal at input node 406) to generate an amplification signal at an output node (e.g., output node 414), and at block 604, sinking, via a signal path (e.g., signal path 456) coupled to the output node, current at a subharmonic of a fundamental frequency of the amplification signal. In certain aspects, an impedance of the signal path may be greater than a load impedance of the amplifier at the fundamental frequency of the amplification signal. In certain aspects, the current is sunk via a resonator (e.g., LC resonator 460) of the signal path.

In certain aspects, the controller may tune a resonant frequency of the resonator. In certain aspects, the resonator may include an inductive element (e.g., inductive element 480) coupled in series with a capacitive element (e.g., capacitive element 482). In certain aspects, the controller may tune at least one of a capacitive element (e.g., capacitive element 482) of the resonator or an inductive element (e.g., inductive element 480) of the resonator.

In certain aspects, the resonator may include a capacitive element (e.g., capacitive element 482) and an inductive element (e.g., inductive element 480) coupled to the capacitive element. In this case, the controller may tune another capacitive element (e.g., capacitive element 506) coupled in parallel with the inductive element.

In certain aspects, the resonator includes a capacitive element (e.g., capacitive element 482), a first inductive element (e.g., inductive element 480) coupled to the capacitive element, and a second inductive element (e.g., inductive element 510) coupled to the first inductive element. In this case, the controller may control a switch (e.g., switch 512) coupled in parallel with the first inductive element or the second inductive element.

In certain aspects, the resonator may include a capacitive element (e.g., capacitive element 482) and an inductive element (e.g., inductive element 480) coupled to the capacitive element. In this case, the controller may control a digitally tunable capacitive element coupled in parallel with the capacitive element. Controlling the digitally tunable capacitive element may include selectively coupling a plurality of capacitive elements (e.g., capacitive elements 516, 518) in parallel with the capacitive element (e.g., via switches 520, 522).

In certain aspects, the input signal may be amplified via a first transistor (e.g., HBT 402) and a second transistor (e.g. HBT 404). A collector of the first transistor may be coupled to a base of the second transistor, and a collector of the second transistor may be coupled to the output node.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits.

One or more of the components, steps, features, and/or functions illustrated herein may be rearranged and/or combined into a single component, step, feature, or function or embodied in several components, steps, or functions. Additional elements, components, steps, and/or functions may also be added without departing from novel features disclosed herein. The apparatus, devices, and/or components illustrated herein may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for." In certain aspects, means for amplifying may include a transistor, such as the HBT 406. Means for sinking may include a resonator, such as the LC resonator 460.

These apparatus and methods are described in the detailed description and illustrated in the accompanying drawings by various blocks, modules, components, circuits, steps, processes, algorithms, etc. (collectively referred to as "elements"). These elements may be implemented using hardware, software, or combinations thereof. Whether such elements are implemented as hardware or software depends upon the particular application and design constraints imposed on the overall system.

What is claimed is:

1. An amplifier comprising:
a transistor coupled to an output of the amplifier; and
an inductor-capacitor (LC) resonator coupled between the output of the amplifier and a reference potential node, a resonant frequency of the resonator being set to be at a subharmonic of a fundamental frequency of the amplifier, and an impedance of the resonator being greater than a load impedance of the amplifier at the fundamental frequency of the amplifier, wherein the LC resonator comprises:
a capacitive element;
an inductive element coupled to the capacitive element; and
a variable capacitive element coupled in parallel with the inductive element.

2. An amplifier comprising:
a transistor coupled to an output of the amplifier; and
an inductor-capacitor (LC) resonator coupled between the output of the amplifier and a reference potential node, a resonant frequency of the resonator being set to be at a subharmonic of a fundamental frequency of the amplifier, and an impedance of the resonator being greater than a load impedance of the amplifier at the fundamental frequency of the amplifier, wherein the LC resonator comprises:
a capacitive element;
a first inductive element coupled to the capacitive element;
a second inductive element coupled to the first inductive element; and a switch coupled in parallel with the second inductive element.

3. An amplifier comprising:
a transistor coupled to an output of the amplifier; and
an inductor-capacitor (LC) resonator coupled between the output of the amplifier and a reference potential node, a resonant frequency of the resonator being set to be at a subharmonic of a fundamental frequency of the amplifier, and an impedance of the resonator being greater than a load impedance of the amplifier at the fundamental frequency of the amplifier, wherein the LC resonator comprises:
a capacitive element;
an inductive element coupled to the capacitive element; and
a digitally tunable capacitive element coupled in parallel with the capacitive element.

4. The amplifier of claim 3, wherein the digitally tunable capacitive element comprises a plurality of capacitive elements selectively coupled in parallel with the capacitive element.

5. The amplifier of claim 1, wherein a collector of the transistor is coupled to the output of the amplifier, and wherein an emitter of the transistor is coupled to the reference potential node.

6. The amplifier of claim 1, further comprising another transistor having a collector coupled to a base of the transistor.

7. The amplifier of claim 6, wherein a collector of the transistor is coupled to a first voltage supply node, and wherein the collector of the other transistor is coupled to a second voltage supply node, the amplifier further comprising an isolation inductive element coupled between the first voltage supply node and the second voltage supply node.

8. The amplifier of claim 1, further comprising an impedance-matching network coupled between the transistor and the output of the amplifier.

9. The amplifier of claim 1, wherein the amplifier comprises a power amplifier and wherein the transistor comprises a heterojunction bipolar transistor.

10. A method for signal amplification, comprising:
amplifying, via an amplifier, an input signal to generate an amplification signal at an output node;
sinking, via a signal path coupled to the output node, current at a subharmonic of a fundamental frequency of the amplification signal, an impedance of the signal path being greater than a load impedance of the amplifier at the fundamental frequency of the amplification signal wherein:
the current is sunk via a resonator of the signal path; and
the resonator comprises a capacitive element and an inductive element coupled to the capacitive element; and
tuning another capacitive element coupled in parallel with the inductive element.

11. A method for signal amplification, comprising:
amplifying, via an amplifier, an input signal to generate an amplification signal at an output node;
sinking, via a signal path coupled to the output node, current at a subharmonic of a fundamental frequency of the amplification signal, an impedance of the signal path being greater than a load impedance of the amplifier at the fundamental frequency of the amplification signal, wherein:
the current is sunk via a resonator of the signal path; and
the resonator comprises a capacitive element, a first inductive element coupled to the capacitive element, and a second inductive element coupled to the first inductive element; and
controlling a switch coupled in parallel with the second inductive element.

12. A method for signal amplification, comprising:
amplifying, via an amplifier, an input signal to generate an amplification signal at an output node;
sinking, via a signal path coupled to the output node, current at a subharmonic of a fundamental frequency of the amplification signal, an impedance of the signal path being greater than a load impedance of the amplifier at the fundamental frequency of the amplification signal, wherein:
the current is sunk via a resonator of the signal path; and
the resonator comprises a capacitive element and an inductive element coupled to the capacitive element; and
controlling a digitally tunable capacitive element coupled in parallel with the capacitive element.

13. The method of claim 12, wherein controlling the digitally tunable capacitive element comprises selectively coupling a plurality of capacitive elements in parallel with the capacitive element.

14. The method of claim 10, wherein the input signal is amplified via a first transistor and a second transistor, a collector of the first transistor being coupled to a base of the second transistor and a collector of the second transistor being coupled to the output node.

15. The amplifier of claim 2, wherein a collector of the transistor is coupled to the output of the amplifier, and wherein an emitter of the transistor is coupled to the reference potential node.

16. The amplifier of claim 2, further comprising another transistor having a collector coupled to a base of the transistor.

17. The amplifier of claim 16, wherein a collector of the transistor is coupled to a first voltage supply node, and wherein the collector of the other transistor is coupled to a second voltage supply node, the amplifier further comprising an isolation inductive element coupled between the first voltage supply node and the second voltage supply node.

18. The amplifier of claim 2, further comprising an impedance-matching network coupled between the transistor and the output of the amplifier.

19. The amplifier of claim 2, wherein the amplifier comprises a power amplifier and wherein the transistor comprises a heterojunction bipolar transistor.

20. The amplifier of claim 3, wherein a collector of the transistor is coupled to the output of the amplifier, and wherein an emitter of the transistor is coupled to the reference potential node.

21. The amplifier of claim 3, further comprising another transistor having a collector coupled to a base of the transistor.

22. The amplifier of claim 21, wherein a collector of the transistor is coupled to a first voltage supply node, and wherein the collector of the other transistor is coupled to a second voltage supply node, the amplifier further comprising an isolation inductive element coupled between the first voltage supply node and the second voltage supply node.

23. The amplifier of claim 3, further comprising an impedance-matching network coupled between the transistor and the output of the amplifier.

24. The amplifier of claim 3, wherein the amplifier comprises a power amplifier and wherein the transistor comprises a heterojunction bipolar transistor.

25. The method of claim 11, wherein the input signal is amplified via a first transistor and a second transistor, a collector of the first transistor being coupled to a base of the second transistor and a collector of the second transistor being coupled to the output node.

26. The method of claim 12, wherein the input signal is amplified via a first transistor and a second transistor, a collector of the first transistor being coupled to a base of the second transistor and a collector of the second transistor being coupled to the output node.

27. The method of claim 10, wherein the amplifier comprises a power amplifier, wherein the amplifier comprises a transistor coupled to the output node, and wherein the transistor comprises a heterojunction bipolar transistor.

28. The method of claim 11, wherein the amplifier comprises a power amplifier, wherein the amplifier comprises a transistor coupled to the output node, and wherein the transistor comprises a heterojunction bipolar transistor.

29. The method of claim 12, wherein the amplifier comprises a power amplifier, wherein the amplifier comprises a transistor coupled to the output node, and wherein the transistor comprises a heterojunction bipolar transistor.

* * * * *